(12) United States Patent
Takeuchi et al.

(10) Patent No.: US 11,637,198 B2
(45) Date of Patent: Apr. 25, 2023

(54) MANUFACTURING METHOD OF SEMICONDUCTOR DEVICE INCLUDING SEMICONDUCTOR ELEMENT OF INVERSION TYPE

(71) Applicant: DENSO CORPORATION, Kariya (JP)

(72) Inventors: Yuichi Takeuchi, Kariya (JP); Yasuhiro Ebihara, Kariya (JP); Masahiro Sugimoto, Toyota (JP); Yusuke Yamashita, Nagakute (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/511,014

(22) Filed: Oct. 26, 2021

(65) Prior Publication Data
US 2022/0045211 A1    Feb. 10, 2022

Related U.S. Application Data

(60) Division of application No. 16/819,771, filed on Mar. 16, 2020, now Pat. No. 11,201,239, which is a
(Continued)

(30) Foreign Application Priority Data

Sep. 18, 2017    (JP) .............................. JP2017-178445

(51) Int. Cl.
    *H01L 29/78*       (2006.01)
    *H01L 29/06*       (2006.01)
                    (Continued)

(52) U.S. Cl.
CPC ...... *H01L 29/7813* (2013.01); *H01L 29/0619* (2013.01); *H01L 29/0696* (2013.01);
(Continued)

(58) Field of Classification Search
CPC ............. H01L 29/7813; H01L 29/0619; H01L 29/0696; H01L 29/1095; H01L 29/1608;
(Continued)

(56) References Cited

U.S. PATENT DOCUMENTS 6,455,892 B1 *   9/2002   Okuno ................ H01L 29/7828
                                                           257/77
6,551,865 B2 *   4/2003   Kumar ................ H01L 29/8083
                                                          438/137

(Continued)

FOREIGN PATENT DOCUMENTS

JP         2012-033731 A     2/2012
JP            5736683 B2     6/2015
WO       2018/056357 A1     3/2018

*Primary Examiner* — Mohammad M Hoque
(74) *Attorney, Agent, or Firm* — Posz Law Group, PLC

(57) ABSTRACT

A semiconductor device including a semiconductor element is provided. The semiconductor element includes a saturation current suppression layer formed above a drift layer and including electric field block layers arranged in a stripe manner and JFET portions arranged in a stripe manner. The electric field block layers and the JFET portions are alternately arranged. The semiconductor element includes trench gate structures. A longer direction of the trench gate structure intersects with a longer direction of the electric field block layer and a longer direction of JFET portion. The JFET portion includes a first layer having a first conductivity type impurity concentration larger than the drift layer and a second layer formed above the first layer and having a first conductivity type impurity concentration smaller than the first layer.

7 Claims, 9 Drawing Sheets

Related U.S. Application Data continuation of application No. PCT/JP2018/034319, filed on Sep. 17, 2018.

(51) Int. Cl.
  *H01L 29/10* (2006.01)
  *H01L 29/16* (2006.01)
  *H01L 29/66* (2006.01)

(52) U.S. Cl.
  CPC ...... *H01L 29/1095* (2013.01); *H01L 29/1608* (2013.01); *H01L 29/66734* (2013.01)

(58) Field of Classification Search
  CPC .......... H01L 29/66734; H01L 29/0623; H01L 29/0878; H01L 29/0882; H01L 29/0886; H01L 29/7397; H01L 29/66068
  USPC ....................................................... 257/330
  See application file for complete search history.

(56) References Cited

U.S. PATENT DOCUMENTS

| | | | |
|---|---|---|---|
| 2005/0029589 A1* | 2/2005 | Takahashi | H01L 29/7801 257/E29.066 |
| 2006/0192256 A1 | 8/2006 | Cooper et al. | |
| 2011/0254010 A1 | 10/2011 | Zhang | |
| 2014/0175459 A1 | 6/2014 | Yamamoto et al. | |
| 2016/0247910 A1 | 8/2016 | Suzuki et al. | |
| 2017/0213908 A1* | 7/2017 | Fursin | H01L 29/407 |
| 2019/0140091 A1 | 5/2019 | Kinoshita et al. | |
| 2020/0235239 A1 | 7/2020 | Noborio et al. | |
| 2020/0243404 A1 | 7/2020 | Kaji et al. | |

* cited by examiner

MANUFACTURING METHOD OF SEMICONDUCTOR DEVICE INCLUDING SEMICONDUCTOR ELEMENT OF INVERSION TYPE

CROSS REFERENCE TO RELATED APPLICATIONS

The present application is a divisional application of U.S. Utility application Ser. No. 16/819,771 filed on Mar. 16, 2020, which is a continuation application of International Patent Application No. PCT/JP2018/034319 filed on Sep. 17, 2018, which designated the U.S. and claims the benefit of priority from Japanese Patent Application No. 2017-178445 filed on Sep. 18, 2017. The entire disclosures of all of the above applications are incorporated herein by reference.

TECHNICAL FIELD

The present disclosure relates to a semiconductor device and a manufacturing method for the same, and is particularly suitable when applied to a semiconductor element using a wide band gap semiconductor such as silicon carbide (hereinafter referred to as SiC) and a manufacturing method for the same.

BACKGROUND

A semiconductor device is required to achieve both low on-resistance and low saturation current.

SUMMARY

The present disclosure provides a semiconductor device and a manufacturing method for a semiconductor device.

In an aspect of the present disclosure, a semiconductor device comprises a semiconductor element of inversion-type. The semiconductor element comprises: a substrate made of semiconductor and having a first conductivity type or a second conductivity type; a drift layer formed above the substrate, made of semiconductor, having the first conductivity type, and having an impurity concentration smaller than the substrate; and a saturation current suppression layer formed above the drift layer and including a plurality of electric field block layers and a plurality of JFET portions, wherein: the electric field block layers are made of semiconductor, have the second conductivity type, and are arranged in a stripe manner; a longer direction of a respective electric field block layer is one direction; the JFET portions are made of semiconductor, have the first conductivity type, and are arranged in a stripe manner; a longer direction of a respective JFET portion is the one direction; and the electric field block layers and the JFET portions are alternately arranged. The semiconductor element further comprises: a base region formed above the saturation current suppression layer, made of semiconductor, and having the first conductivity type; a source region formed above the base region, made of semiconductor, having the first conductivity type, and having a first conductivity type impurity concentration larger than the drift layer; and a plurality of trench gate structures arranged in a stripe manner, wherein: a longer direction of a respective trench gate structure intersects with the one direction; a respective gate trench structures includes a gate insulating film and a gate electrode; the gate insulating film covers an inner wall surface of a gate trench; the gate trench is formed from a surface of the source region and is deeper than the base region; and the gate electrode is arranged on the gate insulating film. The semiconductor element further comprises: an interlayer insulating film covering the gate electrode and the gate insulating film, wherein a contact hole is formed in the interlayer insulating film; a source electrode electrically connected to the source region via the contact hole; and a drain electrode formed on a back side of the substrate, wherein a respective JFET portion includes, in a trench penetrating the electric field block layer and having a bottom surface to expose the drift layer, (i) a first layer formed on the bottom surface and a side surface of the trench, and having a first conductivity type impurity concentration larger than the drift layer, and (ii) a second layer formed above the first layer and having a first conductivity type impurity concentration smaller than the first layer; and by applying a gate voltage to the gate electrode and applying a voltage for a normal operation to the drain electrode as a drain voltage, a channel region is formed in a portion of the base region that contacts with the trench gate structure and a current flows between the source electrode and the drain electrode via the source region and the JEFT portion.

In an aspect of the present disclosure, a manufacturing method for a semiconductor device including a semiconductor element of inversion type comprises: preparing a substrate made of semiconductor and having a first conductivity type or a second conductivity type; forming a drift layer above the substrate, wherein the drift layer is made of semiconductor, has the first conductivity type, and has an impurity concentration smaller than the substrate; forming an electric field block layer above the drift layer, wherein the electric field block layer is made of semiconductor and has the second conductivity type; forming a plurality of trenches arranged in a stripe manner in the electric field block layer so that a longer direction of a respective trench is one direction, and thereafter, forming a plurality of JFET portions by providing semiconductor of the first conductivity type in the plurality of trenches, thereby forming a saturation current suppression layer which includes a plurality of electric field block layers arranged in a stripe manner and the plurality of JFET portions arranged in a stripe manner, wherein a longer direction of a respective JFET portion is the one direction, a longer direction of a respective electric field block layers is the one direction, and the electric field block layers and the JFET portions are alternately arranged; forming a current dispersion layer above the saturation current suppression layer, wherein the current dispersion layer is made of semiconductor, has the first conductivity type, and has a first conductivity type impurity concentration larger than the drift layer; forming a base region above the saturation current suppression layer, wherein the base region is made of semiconductor and has the second conductivity type; forming a source region above the base region, wherein the source region is made of semiconductor, has the first conductivity type, and has a first conductivity type impurity concentration larger than the drift layer; forming a plurality of trench gate structures, including (i) forming a plurality of gate trenches which are from a surface of the source region and deeper than the base region and which are arranged in a stripe manner, wherein a longer direction of a respective gate trench intersects with the one direction, and (ii) forming a gate insulating film on an inner wall surface of a respective gate trench and forming a gate electrode on the gate insulating film; forming a source electrode electrically connected to the source region; and forming a drain electrode on a back side of the substrate. Forming the plurality of JFET portions includes forming: a first layer located at a bottom surface and a side surface of the trench and having a first conductivity type impurity concentration larger than the drift layer; and a second layer located above the first layer and having a first conductivity type impurity concentration smaller than the drift layer.

DETAILED DESCRIPTION

Figure 1:
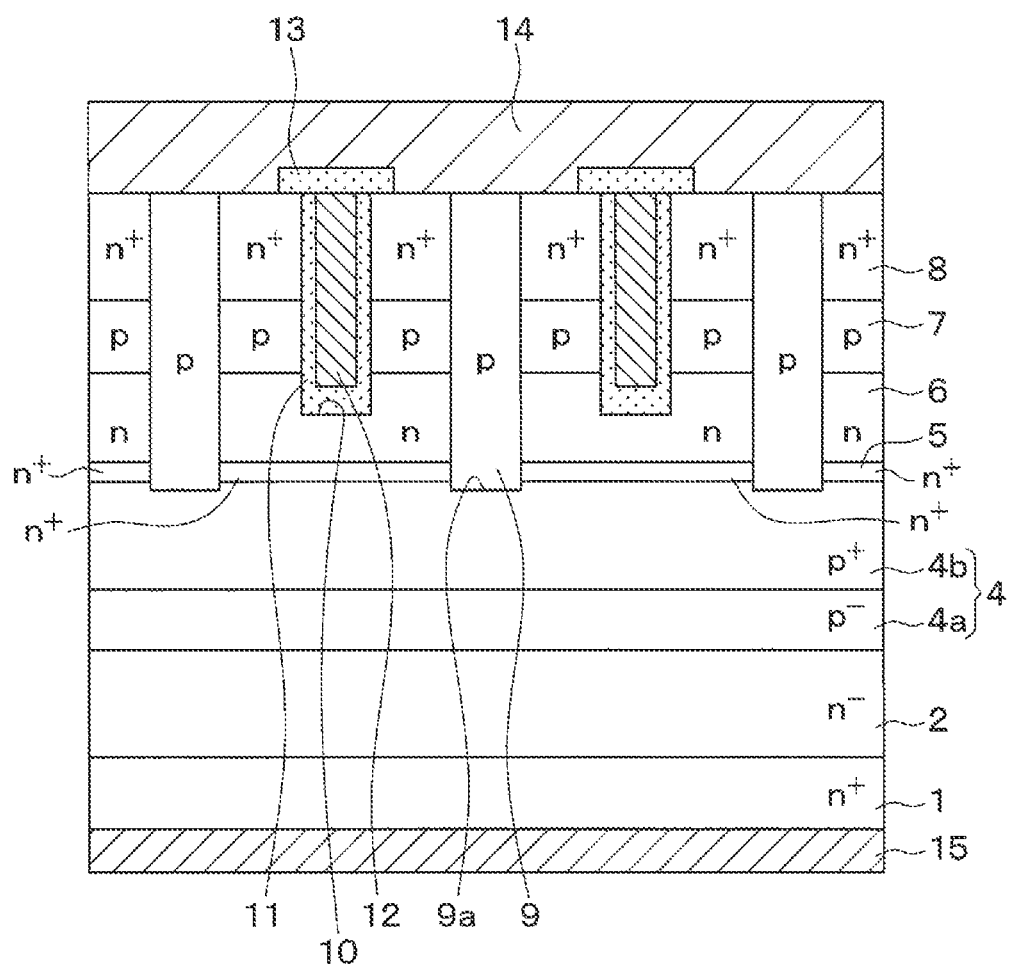
FIG. 1 is a sectional view of an SiC semiconductor device according to a first embodiment.

In an SiC semiconductor device, it is necessary to reduce on-resistance in order to reduce switching loss or the like; however, a current flowing in a semiconductor element at a time of short-circuit of a load increases in inverse proportion to the on-resistance of the semiconductor element. In other words, a semiconductor element having a smaller on-resistance value has a larger saturation current at the time of the load short-circuit. As a result, the semiconductor element is likely to be damaged by self-heating, so that tolerance of the SiC semiconductor device at the time of the load short-circuit is reduced. For this reason, there is a trade-off relationship between the reduction in the on-resistance and the improvement in the tolerance of the SiC semiconductor device at the time of the load short-circuit. The improvement in this trade-off relationship, that is, achievement of both the low on-resistance and the low saturation current, is desired.

In this regard, for realizing both the low on-resistance and the low saturation current, a proposed SiC semiconductor device includes a MOSFET in which an impurity concentration of a portion of a p-type base region near a channel is different from that of a JFET portion. In this SiC semiconductor device, the impurity concentration of the p-type base region is provided with a gradient in the depth direction so that the impurity concentration is small near the channel and becomes larger in a direction toward the bottom. In such a configuration, since the impurity concentration of the p-type base region is small near the channel, it is possible to realize low on-resistance. In addition, the JFET portion of the p-type base region is provided with a desired impurity concentration so as to pinch off an n-type drift layer between the adjacent p-type base regions, so that a low saturation current can be realized. Therefore, it is possible to attempt to achieve both low on-resistance and low saturation current in the SiC semiconductor device.

However, in the SiC semiconductor device of Patent Literature 1, the JFET resistance increases, when the impurity concentration of the JFET portion of the p-type base region is increased or an interval of adjacent p-type base regions at the JFET portion is decreased so that high tolerance is obtained as low saturation current. For this reason, it is impossible to achieve both low on-resistance and low saturation current.

It is an object of the present disclosure to provide a semiconductor device capable of achieving both low on-resistance and low saturation current, and to provide a manufacturing method for the same.

A semiconductor device in an aspect of the present disclosure comprises a semiconductor element of inversion-type, the semiconductor element including: a substrate made of semiconductor and having a first conductivity type or a second conductivity type; a drift layer formed above the substrate, made of semiconductor, having the first conductivity type, and having an impurity concentration smaller than the substrate; a saturation current suppression layer formed above the drift layer and including a plurality of electric field block layers and a plurality of JFET portions, wherein the electric field block layers are made of semiconductor, have the second conductivity type, and are arranged in a stripe manner, wherein a longer direction of a respective electric field block layer is one direction, wherein the JFET portions are made of semiconductor, have the first conductivity type, and are arranged in a stripe manner, wherein a longer direction of a respective JFET portion is one direction, wherein the electric field block layers and the JFET portions are alternately arranged; a base region formed above the saturation current suppression layer, made of semiconductor, and having the first conductivity type; a source region formed above the base region, made of semiconductor, having the first conductivity type, and having a first conductivity type impurity concentration larger than the drift layer; a plurality of trench gate structures arranged in a stripe manner, wherein a longer direction of a respective trench gate structure intersects with the one direction, wherein a respective gate structures includes a gate insulating film and a gate electrode, wherein the gate insulating film covers an inner wall surface of a gate trench, wherein the gate trench is formed from a surface of the source region and is deeper than the base region, wherein the gate electrode is arranged on the gate insulating film; an interlayer insulating film covering the gate electrode and the gate insulating film, wherein a contact hole is formed in the interlayer insulating film; a source electrode electrically connected to the source region via the contact hole; and a drain electrode formed on a back side of the substrate. In this structure, the JFET portion includes, in a trench penetrating the electric field block layer and having a bottom surface to expose the drift layer, a first layer formed on the bottom surface and a side surface of the trench, having a first conductivity type impurity concentration larger than the drift layer and a second layer formed on the first layer and having a first conductivity type impurity concentration smaller than the first layer.

As described above, there is the saturation current suppression layer including the JFET portions and the electric field block layers. Therefore, during a normal operation, the first layer of the JFET portion functions as a layer that adjusts extension of a depletion layer, and extension of the deletion layer from the electric field block layer side into the JFET portion can be suppressed and narrowing of a current path can be suppressed, and therefore, it is possible to provide low on-resistance.

When the drain voltage becomes higher than the voltage for the normal operation due to short-circuit of a load or the like, the depletion layer extending from the electric field block layer side toward the first layer extends more than thickness of the first layer and the JFET portion is immediately pinched off. For this reason, it is possible to maintain low saturation current and it is possible to improve tolerance of the semiconductor device against the short-circuit of a load or the like. Therefore, it is possible to provide the semiconductor device capable of achieving both the low on-resistance and the low saturation current.

Hereinafter, embodiments of the present disclosure will be described with reference to the drawings. In the description of the following embodiments, the same reference signs are given to the same or equivalent portions.

First Embodiment

Figure 2:
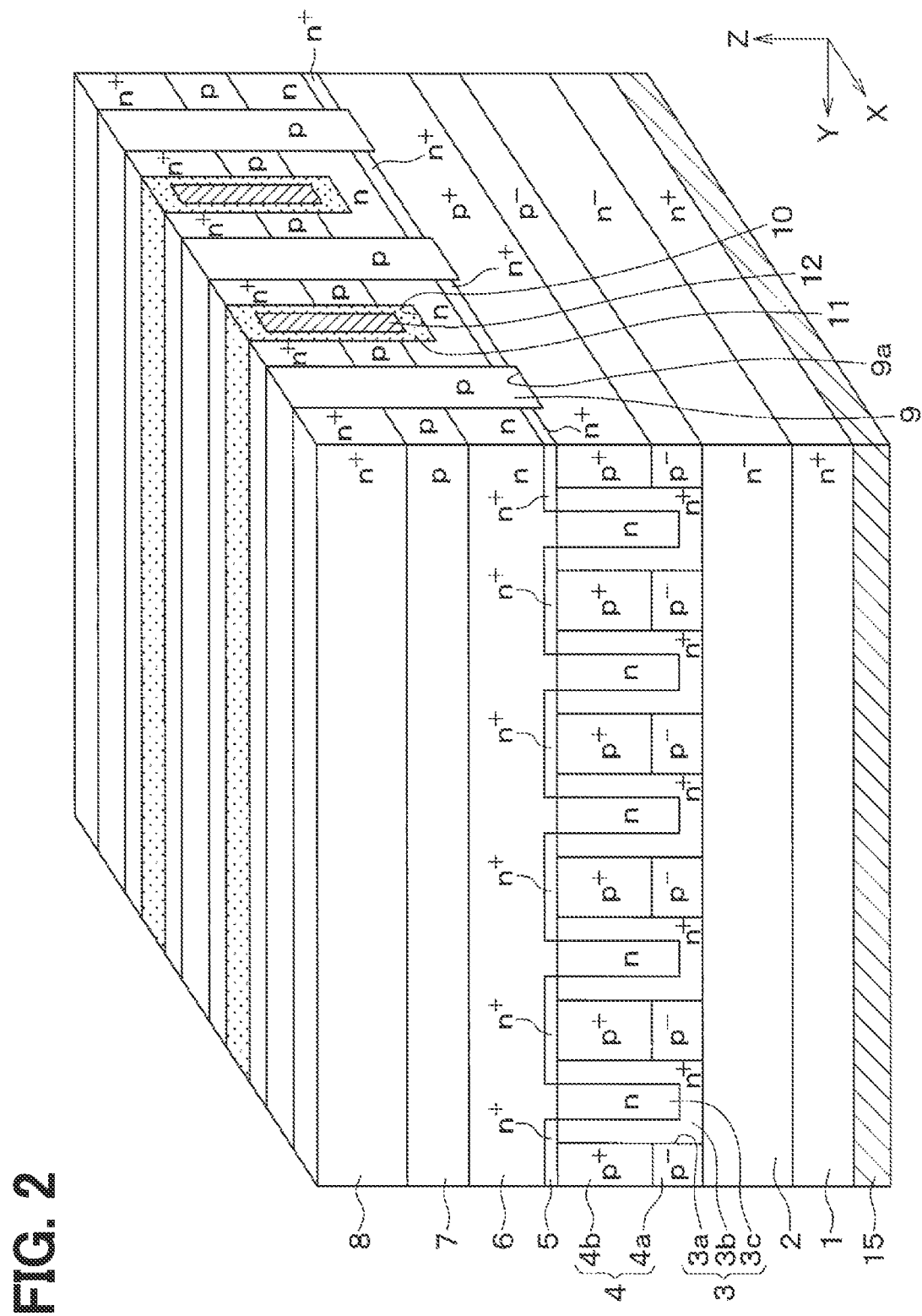
FIG. 2 is a perspective sectional view showing part of the SiC semiconductor device shown in FIG. 1.

A first embodiment will be described. In an SiC semiconductor device according to the present embodiment, a vertical MOSFET shown in FIG. 1 and FIG. 2 is formed as a semiconductor element. FIG. 2 is a perspective view of FIG. 1 seen from a left side and omitting in part a configuration of the SiC semiconductor device for easy view of the layout of respective portions. The vertical MOSFET shown in these drawings is formed in a cell region of the SiC semiconductor device, and the SiC semiconductor device is formed such that an outer peripheral breakdown withstand structure is formed so as to surround the cell region; however, only the vertical MOSFET is shown in the drawings. In the following, as shown in FIG. 2, the description will be given on assumption that a width direction of the vertical MOSFET is an X direction, a near-to-far direction of the vertical MOSFET intersecting with the X direction is a Y direction, and a thickness direction or a depth direction of the vertical MOSFET, that is, a normal direction to the XY plane, is a Z direction.

In the SiC semiconductor device, an n$^+$-type substrate 1 made of SiC is used as a semiconductor substrate. An n$^-$-type drift layer 2 made of SiC is formed on a main surface of the n$^+$-type substrate 1. The n$^+$-type substrate 1 has the (0001) Si plane at its surface and has, for example, an n-type impurity concentration of $5.9 \times 10^{18}/cm^3$, and a thickness of 100 µm. For example, the n$^-$-type drift layer 2 has an n-type impurity concentration of $7.0 \times 10^{15}$ to $1.0 \times 10^{16}/cm^3$ and a thickness of 8.0 µm.

Electric field block layers 4 and JFET portions 3 made of SiC are formed above the n$^-$-type drift layer 2, and the n$^-$-type drift layers 2 are connected to the JFET portions 3 at positions spaced apart from the n$^+$-type substrate 1.

The JFET portions 3 and the electric field block layers 4 constitute a saturation current suppression layer, and both extend in the X direction, and are alternately and repeatedly arranged in the Y direction. That is, when viewed from the direction normal to the main surface of the n$^+$-type substrate 1, the JFET portions 3 are arranged in strips, that is, a stripe manner and the electric field block layers 4 are arranged in strips, that is, a stripe manner.

In a trench 3a formed to penetrate the electric field block layer 4, the JFET portion 3 includes an n$^+$-type layer 3b having an n-type impurity concentration larger than the n$^-$-type drift layer 2 and an n-type layer 3c having a smaller n-type impurity concentration than the n$^+$-type layer 3b. The n$^+$-type layer 3b and the n-type layer 3c correspond to a first layer and a second layer, respectively. The n$^+$-type layer 3b is formed so as to cover a bottom surface and a side surface of the trench 3a, and the n-type layer 3c is formed to, while covering a surface of the n$^+$-type layer 3b, fill the remaining part other than the n$^+$-type layer 3b in the trench 3a.

The trench 3a has, for example, a width, that is, a dimension in the Y direction, of 0.25 µm and a depth of 1.5 µm. A formation interval of the trenches 3a, that is, a trench pitch, is set smaller than a formation interval of the below-described trench gate structures, that is, a cell pitch. In the present embodiment, the depth of the trench 3a is the same as the thickness of the electric field block layer 4 so that the bottom surface of the JFET portion 3 and the bottom surface of the electric field block layer 4 are on the same plane. The bottom surface of the trench 3a is provided by the surface of the n$^-$-type drift layer 2. For example, the n$^+$-type layer 3b has an n-type impurity concentration of $5.0 \times 10^{17}$ to $2.0 \times 10^{18}/cm^3$ and a thickness of 0.05 µm. For example, the n-type layer 3c has an n-type impurity concentration of $5.0 \times 10^{15}$ to $2.0 \times 10^{16}/cm^3$ and a width of 0.15 µm.

The electric field block layer 4 includes a p$^-$-type layer 4a and a p$^+$-type layer 4b having different p-type impurities. The p$^-$-type layer 4a corresponds to a lower layer portion and is formed to contact with the n$^-$-type drift layer 2. The p$^+$-type layer 4b corresponds to an upper layer portion, and is formed above the p$^-$-type layer 4a, that is, at a position spaced apart from the n$^-$-type drift layer 2. The p$^-$-type layer 4a has, for example, a p-type impurity concentration of $1.0 \times 10^{16}$ to $5.0 \times 10^{16}/cm^3$ and a thickness of 0.5 µm. The p$^+$-type layer 4b has, for example, a p-type impurity concentration of $3.0 \times 10^{17}$ to $1.0 \times 10^{18}/cm^3$ and a thickness of 1.0 µm. In the present embodiment, the p-type impurity concentrations of the p$^-$-type layer 4a and the p$^+$-type layer 4b are constant in the depth direction. Further, as described above, in the present embodiment, because the depth of the trench 3a is the same as the thickness of the electric field block layer 4, the depth of the trench 3a is 1.5 µm which is addition of the thicknesses of the p$^-$-type layer 4a and the p$^+$-type layer 4b.

Further, an n$^+$-type layers 5 are formed above the electric field block layers 4 and the JFET portions 3. The n$^+$-type layers 5 are formed together with the n$^+$-type layers 3b, and are formed on the surfaces of the p$^+$-type layers 4b. The n$^+$-type layer 5 is formed to connect the n$^+$-type layers 3b formed on the adjacent side surfaces of the adjacent trenches 3a. The n$^+$-type layer 5 has the same n-type impurity concentration and thickness as the n$^+$-type layer 3b. In this regard, based on plane orientation dependency of crystal growth of SiC, the thickness of the n$^+$-type layer 5 may have the same film thickness as a portion of the n$^+$-type layer 3b located at the bottom of the trench 3a and may have a film thickness different than a portion of the n$^+$-type layer 3b located at the side surface of the trench 3a.

The n$^+$-type layer 5 is not formed so as to fill the trench 3a. For this reason, at a time of epitaxial growth in forming the n-type layer 3c, the n-type layer 3c is formable in the trench 3a from a portion where the n$^+$-type layer 5 is not formed.

Furthermore, an n-type current dispersion layer 6 made of SiC is formed above the n-type layer 3c and the n$^+$-type layer 5. The n-type current dispersion layer 6 is a layer that allows a current flowing in a channel to diffuse in the X direction, as described later, and has, for example, a larger n-type impurity concentration than the n$^-$-type drift layer 2. In the present embodiment, the n-type current dispersion layer 6 has the same n-type impurity concentration as the n-type layer 3c in the JFET portion 3, and has a thickness of 0.5 μm.

A p-type base region 7 made of SiC is formed above the n-type current dispersion layer 6. An n$^+$-type source region 8 made of SiC is formed above the p-type base region 7. The n$^+$-type source region 8 is formed above a portion of the p-type base region 7 that corresponds to the n-type current dispersion layer 6.

The p-type base region 7 is thinner than the electric field block layer 4 and has a smaller p-type impurity concentration than the electric field block layer 4, and has, for example, the p-type impurity concentration of $3\times10^{17}/cm^3$ and a thickness of 0.3 μm. In addition, the n$^+$-type source region 8 has an n-type impurity concentration larger than the n-type current dispersion layer 6 and has a thickness of 0.5 μm, for example.

Further, p-type connection layer 9 is formed so as to penetrate the p-type base region 7 and the n-type current dispersion layer 6 from the surface of the n$^+$-type source region 8 to reach the electric field block layer 4. In the present embodiment, the p-type connection layers 9, a longer direction of each of which is a Y direction intersecting with a longer direction of the JFET portion 3 and a longer direction of the electric field block layers 4, are formed in a stripe manner, so that the p-type connection layers 9 are arranged in the x direction. The p-type base region 7 and the electric field block layer 4 are electrically connected via the p-type connection layer 9. In the case of the present embodiment, a deep trench 9a that reaches the electric field block layer 4 from the surface of the n$^+$-type source region 8 through the p-type base region 7 and the n-type current dispersion layer 6 is formed, and the p-type connection layer 9 is embedded in the deep trench 9a. A formation pitch of the p-type connection layers 9 is equal to the cell pitch which is the formation interval of the trench gate structures described later. The width of the p-type connection layer 9 is, for example, 0.4 μm, and the depth is, for example, 1.4 μm.

Furthermore, a gate trench 10 is formed which has, for example, a width of 0.4 μm and a depth that is deeper than an added film thickness of the p-type base region 7 and the n$^+$-type source region 8 by 0.2 to 0.4 μm so as to penetrate the p-type base region 7 and the n$^+$-type source region 8 and reach the n-type current dispersion layer 6. The p-type base region 7 and the n$^+$-type source region 8 described above are arranged so as to contact with a side surface of the gate trench 10. The gate trench 10 is formed to have a rectangular layout with the X direction as its width direction, the Y direction as its longer direction, and the z direction as its depth direction, where the longer direction matches a direction intersecting with the longer directions of the JFET portion 3 and the electric field block layer 4. As shown in FIG. 1, a plurality of gate trenches 10 are arranged at equal intervals in the X direction, are each arranged so as to be sandwiched between the p-type connection layers 9, and have a stripe shape.

For example, as will be described later, the cell pitch being a formation interval of the trench gate structures formed in the gate trenches 10, that is, the cell pitch being an arrangement interval of adjacent gate trenches 10 is, for example, 2 to 3 μm. The width of the gate trench 10 is arbitrary, but is smaller than the cell pitch. In addition, the JFET pitch, which is the interval between the JFET portions 3, that is, the interval between the electric field block layers 4, is set to be smaller than the cell pitch.

A portion of the p-type base region 7 located at the side surface of the gate trench 10 is a channel region connecting the n$^+$-type source region 8 and the n-type current dispersion layer 6 when the vertical MOSFET is operated. The inner wall surface of the trench 10 including the channel region is covered with the gate insulating film 11. A gate electrode 12 made of doped Poly-Si is formed on the surface of the gate insulating film 11, and the gate trench 10 is completely filled with the gate insulating film 11 and the gate electrode 12, thereby forming the trench gate structure.

On the surface of the n$^+$-type source region 8 and the surface of the gate electrode 12, a source electrode 14 and the like are formed via an interlayer insulating film 13. The source electrode 14 is made of a plurality of metals, such as Ni/Al and the like. Among the plurality of metals, a portion that contacts with at least the n-type SiC, specifically, the n$^+$-type source region 8 or the gate electrode 12 in the case of n-type doping, is made of a metal capable of Ohmic contact with the n-type SiC. In addition, among the plurality of metals, a portion that contacts with at least the p-type SiC, specifically, the p-type connection layer 9, is made of a metal capable of Ohmic contact with the p-type SiC. The source electrode 14 is formed on the interlayer insulating film 13 for electrical insulation from the SiC portion, but is electrically in contact with the n$^+$-type source region 8 and the p-type connection layer 9 through the contact holes formed in the interlayer insulating film 13.

Further, a drain electrode 15 electrically connected to the n$^+$-type substrate 1 is formed on the back side of the n$^+$-type substrate 1. With such a structure, the n-channel vertical MOSFET of inversion-type having a trench gate structure is formed. The cell regions are provided by arranging such vertical MOSFETs for a plurality of cells. The SiC semiconductor device is provided by forming the outer peripheral voltage withstand structures such as guard rings (not shown) or the like surrounding the cell regions in which such vertical MOSFETs are formed.

The SiC semiconductor device including the vertical MOSFET configured as described above is operated by, for example, applying a gate voltage Vg of 20 V to the gate electrode 12 in a state where the source voltage Vs is 0 V and the drain voltage Vd is 1 to 1.5 V. That is, when the gate voltage Vg is applied, the vertical MOSFET performs an operation in which a channel region is formed in a portion of the p-type base region 7 that contacts with the gate trench 10 and a current flows between the drain and the source.

At this time, the JFET portions 3 and the electric field block layers 4 function as the saturation current suppression layer and exhibit a saturation current suppression effect of maintaining low saturation current while providing low on-resistance. Specifically, while the JFET portions 3 and the electric field block layers 4 are alternately formed repeatedly, the large concentration n$^+$-type layer 3b is arranged at a portion of the JFET portion 3 that contacts with the electric field block layer 4, so that the n$^+$-type layer 3b functions as a depletion layer, whereby the following operation is performed.

First, in cases where the applied drain voltage Vd is a voltage for a normal operation such as 1 to 1.5 V, for example, the depletion layer extending from the electric field block layer 4 toward the n⁺-type layer 3b has an extension amount smaller than the thickness of the n⁺-type layer 3b. That is, the n⁺-type layer 3b functions as a layer that stops the depletion layer from extending. For this reason, it becomes possible to suppress the extension of the depletion layer into the JFET portion 3 and to suppress the current path from becoming narrow, and therefore, it is possible to achieve low on-resistance.

Furthermore, a portion of the n⁺-type layer 3b where the depletion layer does not extend functions as a current path. Since the n⁺-type layer 3b has a large n-type impurity concentration and a low resistance, the n⁺-type layer 3b functions as a current path, and therefore, it is possible to further reduce the on-resistance.

Furthermore, when the drain voltage Vd becomes higher than the voltage for the normal operation due to short-circuit of a load or the like, the depletion layer extending from the electric field block layer 4 toward the n⁺-type layer 3b has an extension amount that is larger than the thickness of the n⁺-type layer 3b. Then, the JFET portion 3 is immediately pinched off earlier than the n-type current dispersion layer 6. A relationship at this time between the drain voltage Vd and the width of the depletion layer is determined based on the n-type impurity concentration and the thickness of the n⁺-type layer 3b. For this reason, by setting the n-type impurity concentration and the thickness of the n⁺-type layer 3b so that the JFET portions 3 are pinched off when the voltage becomes slightly higher than the drain voltage Vd for the normal operation, it is possible to pinch off the JFET portions 3 even with a low drain voltage. In this way, when the drain voltage Vd becomes higher than the voltage for the normal operation, the JFET portions 3 are immediately pinched off, so that a low saturation current can be maintained, and the tolerance of the SiC semiconductor device in the cases of short-circuit of a load or the like can be improved.

As described above, the JFET portions 3 and the electric field block layers 4 function as the saturation current suppression layer, and exhibit the saturation current suppression effect, and therefore, the SiC semiconductor device can achieve both low on-resistance and low saturation current.

Further, since the JFET portions 3 has a structure intersecting with the trench gate structures, the JFET pitch can be set independently of the cell pitch. Therefore, for example, it becomes possible to set the JFET pitch smaller than the cell pitch as in the present embodiment. This makes it possible to increase formation areas of the JFET portions 3 in which currents flow, and therefore, it is possible to increase a current path density. As a result, it becomes possible to reduce the JFET resistance and to reduce the on-resistance of the vertical MOSFET.

It is also conceivable that the longer directions of the JFET portions 3 and the electric field block layers 4 are made to be the same direction that matches the longer directions of the trench gate structures. However, in such a structure, it is necessary to adjust the JFET pitch to the cell pitch, so that the JFET pitch cannot be set independently of the cell pitch. Therefore, by adopting the structure of the present embodiment in which the JFET pitch can be made smaller than the cell pitch, it is possible to further reduce the on-resistance of the vertical MOSFET.

Because of the electric field block layers 4 between which the JFET portion 3 is sandwiched, the JFET portions 3 and the electric field block layers 4 are constructed alternately and repeatedly. For this reason, even if the drain voltage Vd becomes a high voltage, the extension of the depletion layer extending from below to the n-type drift layer 2 is suppressed by the electric field block layer 4 to prevent from extending to the trench gate structure. Therefore, the electric field suppression effect of reducing the electric field applied to the gate insulating film 11 is exhibited and the gate insulating film 11 can be prevented from being destroyed, so that it is possible to obtain a highly reliable element with high breakdown voltage. In addition, since the extension of the depletion layer to the trench gate structure can be prevented in this way, the n-type impurity concentrations of the n⁻-type drift layer 2 and the JFET portion 3 can be made relatively large, and the low on-resistance can be achieved.

Therefore, it is possible to obtain the SiC semiconductor device having the vertical MOSFET with low on-resistance and high reliability.

Furthermore, not the whole of the electric field block layer 4 is provided by the p⁺-type layer 4b having a large p-type impurity concentration, but a p⁻-type layer 4a having a small p-type impurity concentration is provided at a portion that contacts with the n⁻-type drift layer 2. If it is assumed that the whole of the electric field block layer 4 is provided by only the p⁺-type layer 4b, the depletion layer extends from the electric field block layer 4 toward the n⁻-type drift layer 2. Moreover, the depletion layer in the n⁻-type drift layer 2 extends not only below the electric field block layer 4 but also extends from the boundary position between the electric field block layer 4 and the JFET portion 3 into below the JFET portion 3. That is, the extension amount of the two-dimensional depletion layer extending two-dimensionally in the n⁻-type drift layer 2 increases. For this reason, there is a concern that the current outlet in the JFET portion 3 is narrowed and the on-resistance is increased.

By contrast, in cases where the portion of the electric field block layer 4 that contacts with the n⁻-type drift layer 2 is provided as the p⁻-type layer 4a as in the present embodiment, it is possible to obtain an electric field absorption effect of reducing the amount of extension of the two-dimensional depletion layer into the n⁻-type drift layer 2, wherein the electric field absorption effect corresponds to the small p-type impurity concentration of the p⁻-type layer 4a. Because of this, the narrowing of the current outlet in the JFET portion 3 is suppressed, which makes it possible to maintain the low on-resistance.

The SiC semiconductor device according to the present embodiment includes the semiconductor element of normally-off type in which no current flows between the drain and the source when the gate voltage Vg is not applied, because the channel region is not formed. However, the JFET portion 3 is of a normally-on type because it pinches off only when the drain voltage Vd is higher than the voltage for the normal operation, even in the case of non-application of the gate voltage Vg.

Although examples of the thickness, the depth, and the impurity concentration of respective portions of the vertical MOSFET have been described, these are merely examples, and other thicknesses, depths and impurity concentrations may be adopted as long as the above operation is performed.

For example, the width of the JFET portion 3, that is, the dimension in the arrangement direction in which the plurality of JFET portions 3 are arranged may be set so that the saturation current suppression effect can be obtained. The width of the JFET portion 3 enabling the saturation current suppression effect varies depending on the n-type impurity concentrations of the n⁺-type layer 3b and the n-type layer 3c and the p-type impurity concentration of the electric field block layer. In this regard, the saturation current suppression effect is obtainable in cases where the width of the JFET portion 3 is in a range of 0.2 to 0.5 μm.

Further, the width of the electric field block layer 4, that is, the dimension in the arrangement direction in which a plurality of electric field block layers 4 are arranged may be set in consideration of the low on-resistance and the electric field suppression effect. If the width of the electric field block layer 4 is increased, this relatively reduces a formation ratio of the JFET portion 3 and causes the JFET resistance to increase, and thus, the less the width, the more preferable; however, if the width is too small, the electric field suppression effect is reduced when the depletion layer extends also from the side surface of the electric field block layer 4 at an OFF time. Therefore, the width of the electric field block layer 4 is set in consideration of achievement of the low on-resistance due to the reduction in the JFET resistance and the electric field suppression effect. When the width is in a range of 0.3 to 0.8 μm, it is possible to obtain the electric field suppression effect while providing the low on-resistance.

Next, a method of manufacturing the SiC semiconductor device including the n-channel inversion-type trench gate structure vertical MOSFET according to the present embodiment will be described with reference to the cross-sectional views in the manufacturing process shown in FIGS. 3A to 3H.

Figure 3A:
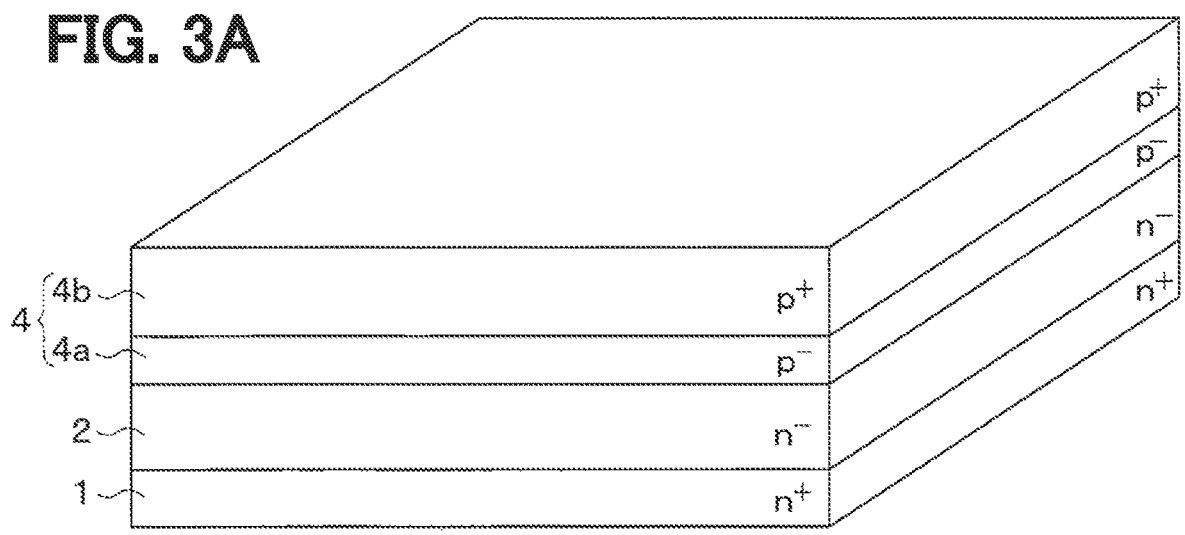
FIG. 3A is a perspective sectional view showing a manufacturing process of the SiC semiconductor device shown in FIGS. 1 and 2.

<Process Shown in FIG. 3A>

First, the n$^+$-type substrate 1 is prepared as the semiconductor substrate. Then, the n$^-$-type drift layer 2 made of SiC is formed on the main surface of the n$^-$-type substrate 1 by epitaxial growth using a CVD (chemical vapor deposition) apparatus (not shown). At this time, what is called an epitaxial substrate in which the n$^-$-type drift layer 2 was previously grown on the main surface of the n$^+$-type substrate 1 may be used. Then, the electric field block layer 4 made of SiC is formed above the n$^-$-type drift layer 2. Specifically, the p$^-$-type layer 4a is formed on the surface of the n$^-$-type drift layer 2, and thereafter, the p$^+$-type layer 4b is subsequently formed on the p$^-$-type layer 4a.

The epitaxial growth is performed such that a gas serving as an n-type dopant, for example, a nitrogen gas, or a gas serving as a p-type dopant, for example, trimethylaluminum (hereinafter, referred to as TMA), is introduced in addition to silane or propane serving as source gases for SiC. Since it is difficult to epitaxially grow p-type SiC subsequent to n-type SiC, the n-type SiC and the p-type SiC may be epitaxially grown by different CVD apparatuses. Furthermore, since the p$^-$-type layer 4a and the p$^+$-type layer 4b have the same conductivity type, they can be easily and continuously formed only by changing the amount of introduced TMA, for example.

Figure 3B:
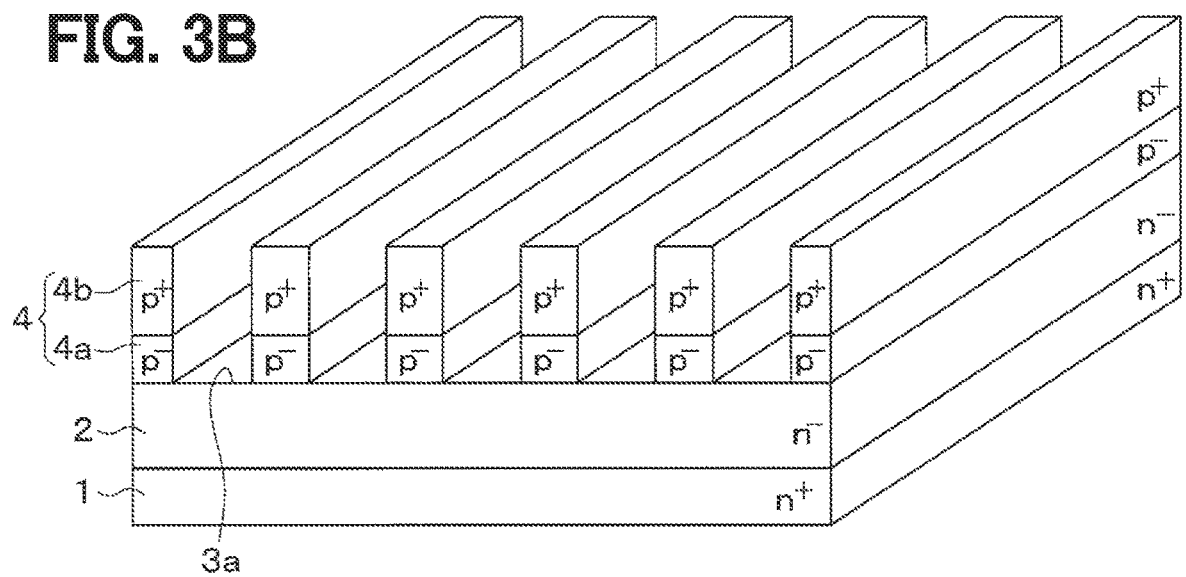
FIG. 3B is a perspective sectional view showing a manufacturing process of the SiC semiconductor device following FIG. 3A.

<Process Shown in FIG. 3B>

A mask (not shown) having openings corresponding to the JFET portions 3 is formed above the electric field block layer 4. Then, the electric field block layer 4 is removed by performing anisotropic etching such as RIE (Reactive Ion Etching) or the like using the mask to form the trenches 3a, so that the n$^-$-type drift layer 2 is exposed at the bottoms of the trenches 3a. Thereafter, the mask used in the etching is removed.

Figure 3C:
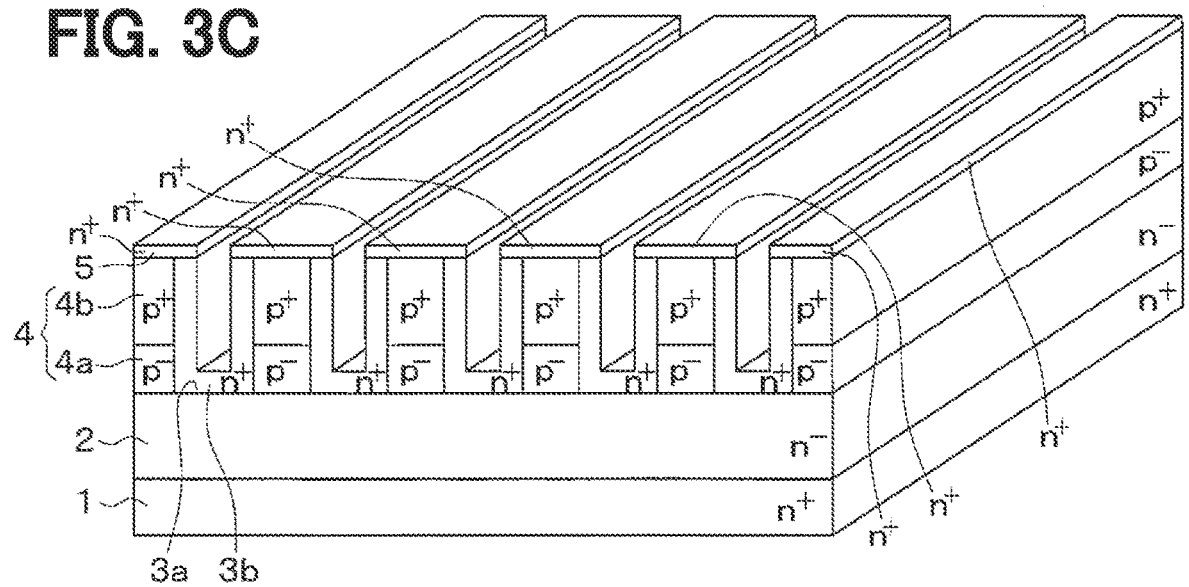
FIG. 3C is a perspective sectional view showing a manufacturing process of the SiC semiconductor device following FIG. 3B.

<Process Shown in FIG. 3C>

By epitaxial growth using a CVD apparatus (not shown), the n$^+$-type layer 3b is formed in the trench 3a and at the same time, the n$^+$-type layer 5 is formed on the surface of the electric field block layer 4.

Figure 3D:
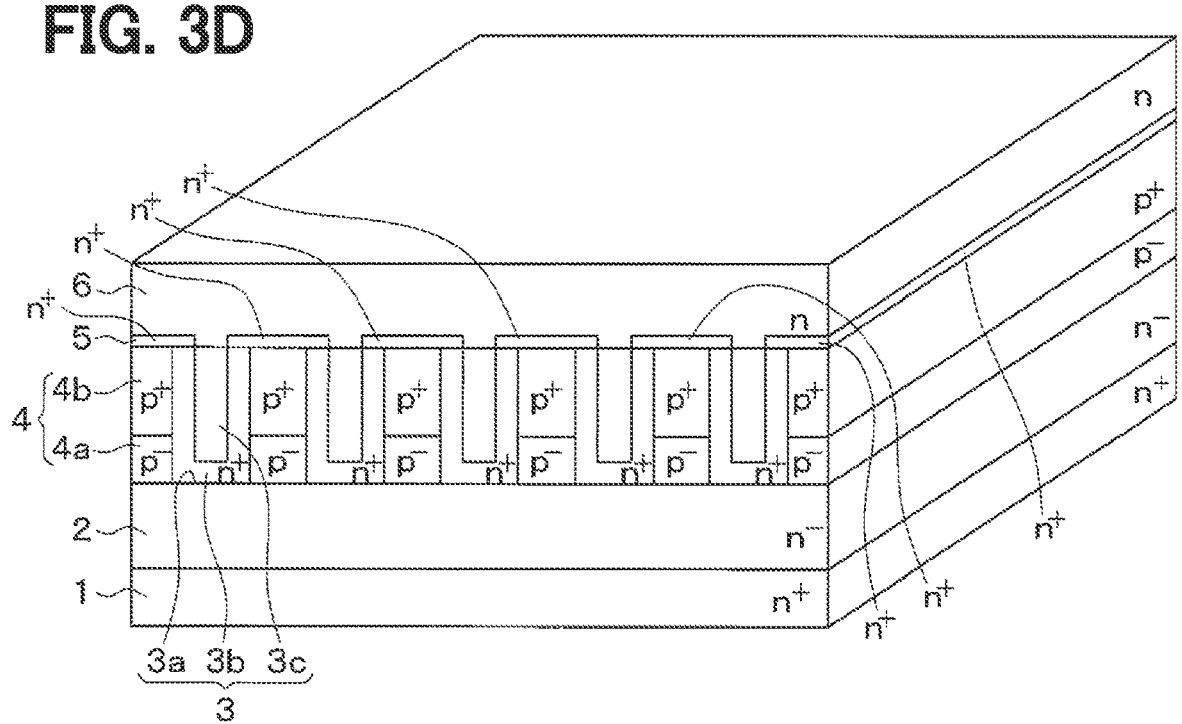
FIG. 3D is a perspective sectional view showing a manufacturing process of the SiC semiconductor device following FIG. 3C.

<Process Shown in FIG. 3D>

Subsequently, n-type SiC is epitaxially grown on the n$^+$-type layer 3b and the n$^+$-type layer 5, thereby the n-type layer 3c is formed and at the same time, the n-type current dispersion layer 6 is formed. At this time, the n$^+$-type layer 3b and the n$^+$-type layer 5, and the n-type layer 3c and the n-type current dispersion layer 6 have the same conductivity type. For this reason, in the CVD apparatus used for the epitaxial growth of the n$^+$-type layer 3b and the n$^+$-type layer 5, it is possible to continuously perform epitaxial growth of the n-type layer 3c and the n-type current dispersion layer 6 by changing the introduction amount of the gas serving as the n-type dopant.

Figure 3E:
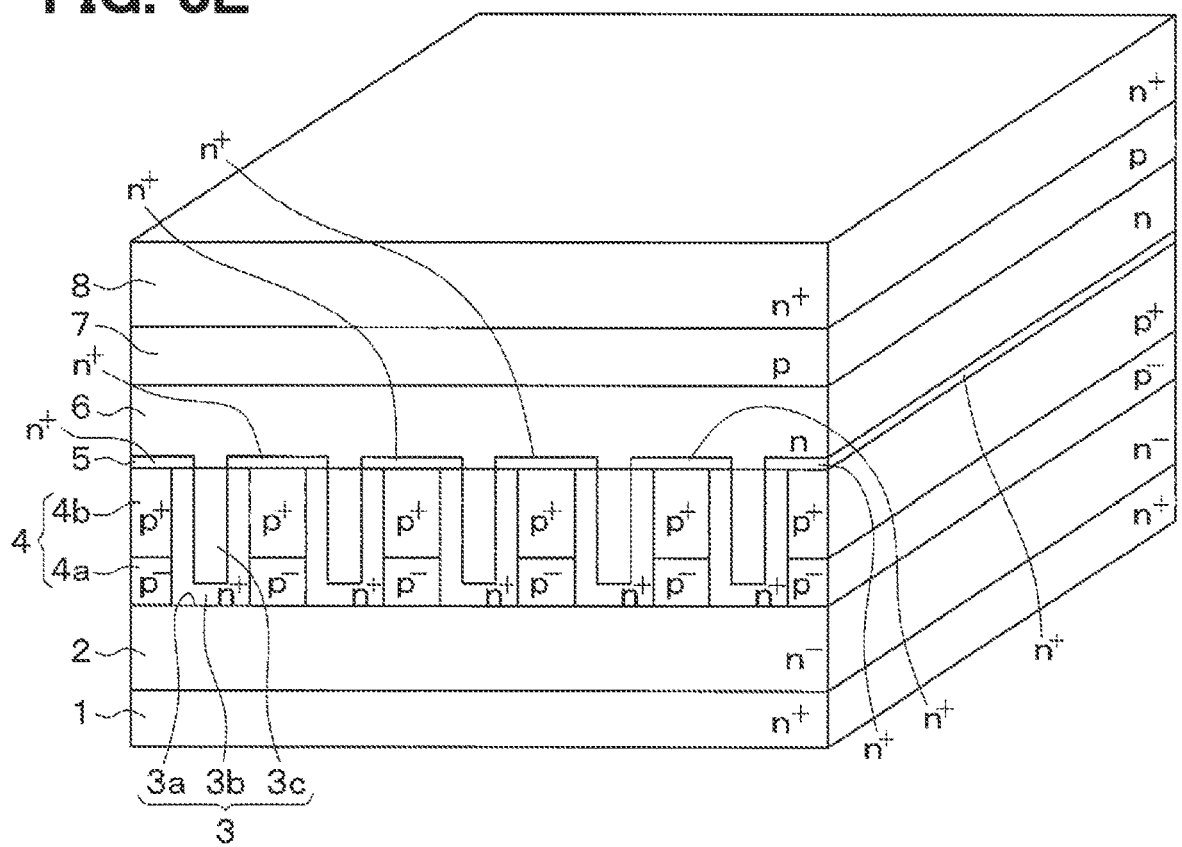
FIG. 3E is a perspective sectional view showing a manufacturing process of the SiC semiconductor device following FIG. 3D.

<Process Shown in FIG. 3E>

The p-type base region 7 and the n$^+$-type source region 8 are epitaxially grown above the n-type current dispersion layer 6 using a CVD apparatus (not shown).

Figure 3F:
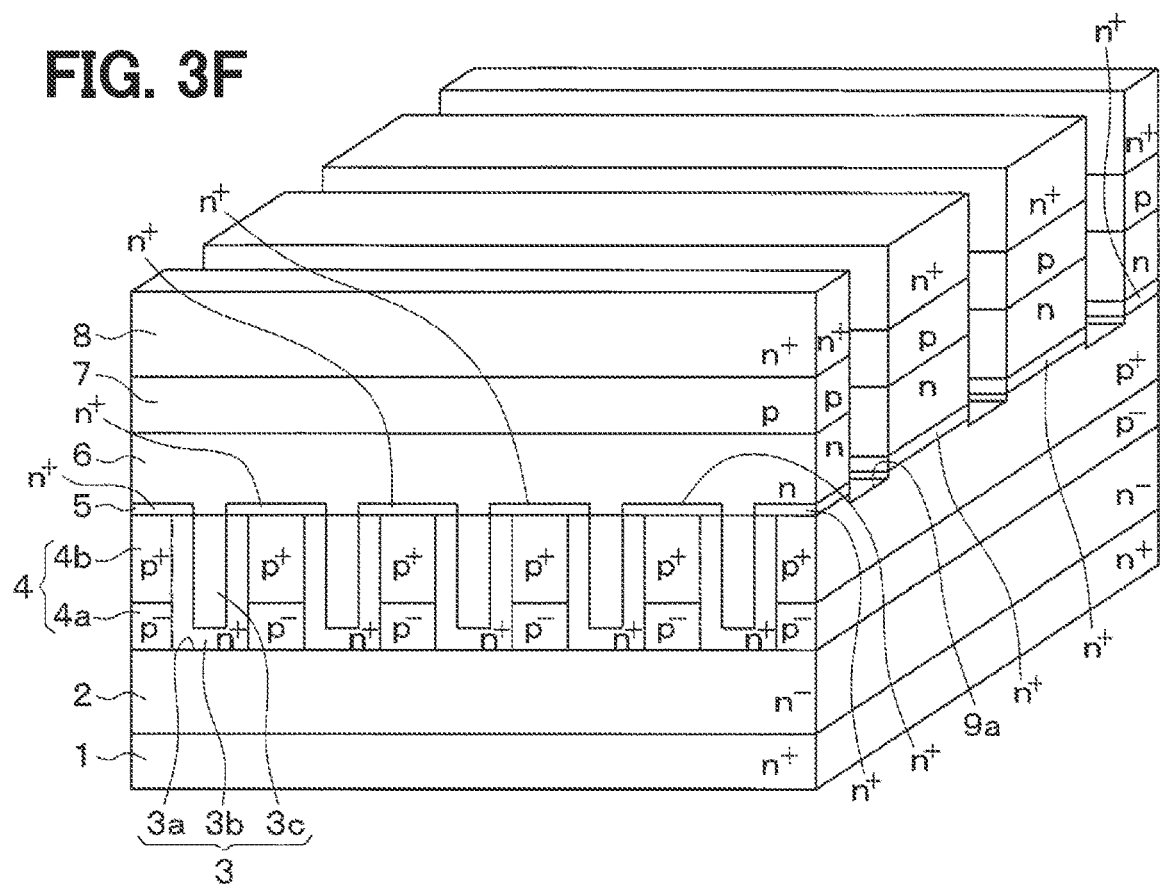
FIG. 3F is a perspective sectional view showing a manufacturing process of the SiC semiconductor device following FIG. 3E.

<Process Shown in FIG. 3F>

A mask (not shown) having openings corresponding to the p-type connection layers 9 is formed on the n$^+$-type source region 8. Then, by performing anisotropic etching such as RIE or the like using the mask, the n$^+$-type source region 8, the p-type base region 7, the n-type current dispersion layer 6, and the n$^+$-type layer 5 are sequentially removed, and the deep trenches 9a reaching the p$^+$-type layers 4b are formed. Then, the mask is removed.

Figure 3G:
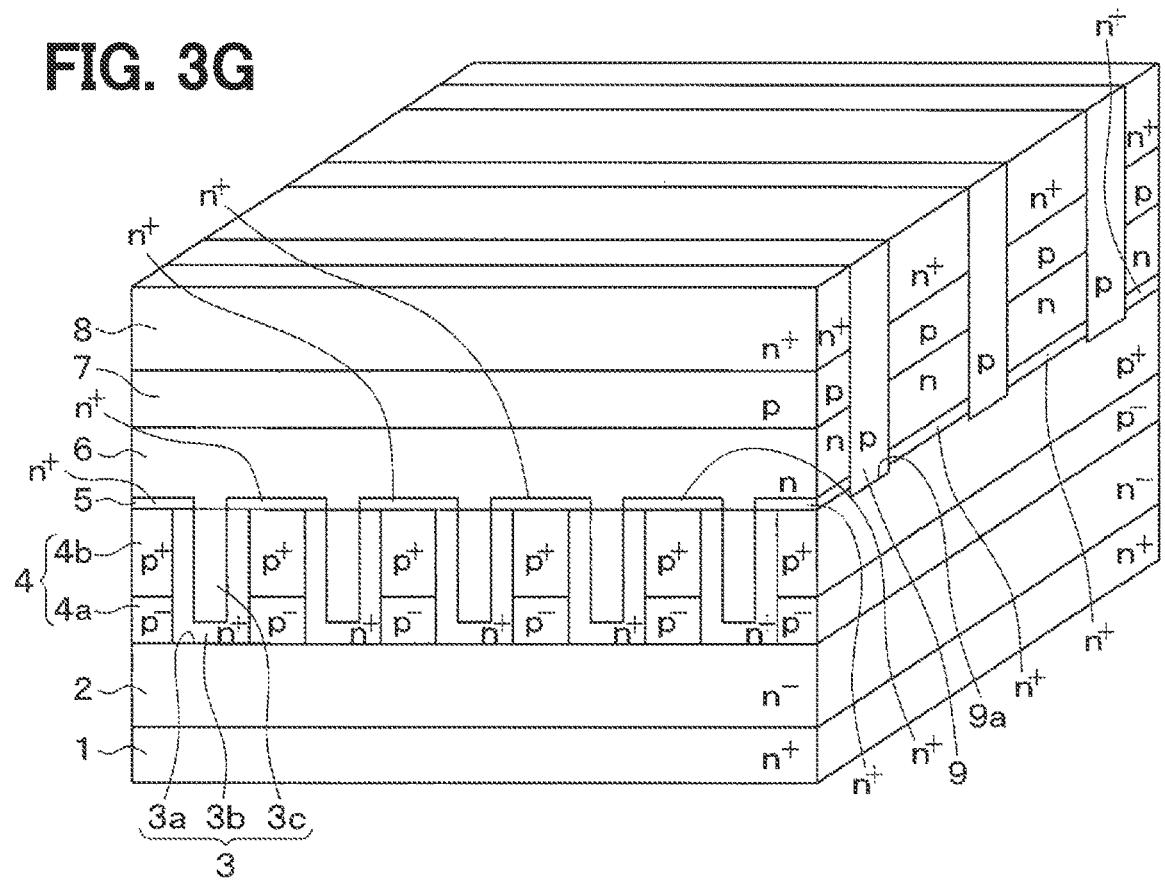
FIG. 3G is a perspective sectional view showing a manufacturing process of the SiC semiconductor device following FIG. 3F.

<Process Shown in FIG. 3G>

By using a CVD apparatus (not shown), p-type SiC is epitaxially grown so as to fill the deep trenches 9a. Then, the p-type connection layers 9 are formed by leaving the p-type SiC only in the deep trenches 9a by etch back.

Figure 3H:
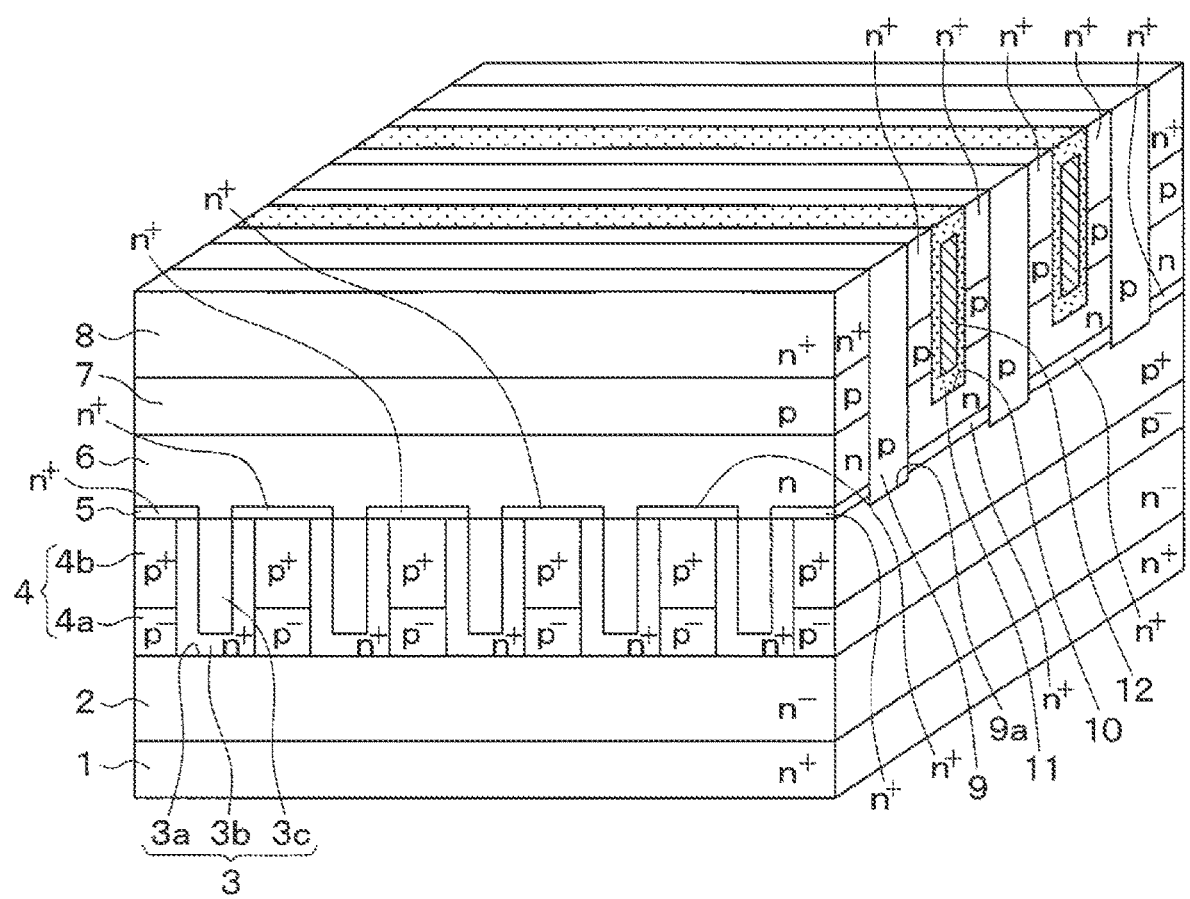
FIG. 3H is a perspective sectional view showing a manufacturing process of the SiC semiconductor device following FIG. 3G.

<Process Shown in FIG. 3H>

After a mask (not shown) is formed above the n$^+$-type source region 8 and the like, openings are made at portions of the mask where the gate trenches 10 are to be formed. Then, by using the mask, the gate trenches 10 are formed by performing anisotropic etching such as RIE (Reactive Ion Etching) or the like.

Thereafter, the mask is removed, and thereafter, for example, thermal oxidation is performed to form the gate insulating films 11, so that the gate insulating film 11 covers the inner wall surface of the gate trench 10 and the surface of the n$^+$-type source region 8. Then, deposition of Poly-Si doped with p-type impurities or n-type impurities is performed, and thereafter, this is etched back to leave the Poly-Si at least in the gate trenches 10 to form the gate electrodes 12. Accordingly, the trench gate structure is completed.

Although subsequent processes are not shown in the drawings, processes described below are performed. Specifically, the interlayer insulating film 13 made of, for example, an oxide film is formed so as to cover the surfaces of the gate electrode 12 and the gate insulating film 11. Further, the contact hole for exposing the n$^+$-type source region 8 and the p-type connection layer 9 is formed in the interlayer insulating film 13 using a mask (not shown). Then, after the electrode material provided by, for example, a laminated structure of plurality of metals is formed on the surface of the interlayer insulation film 13, the source electrode 14 is formed by patterning the electrode material. Furthermore, the drain electrode 15 is formed on the back side of the n$^+$-type substrate 1. Thus, the SiC semiconductor device according to the present embodiment is completed.

The SiC semiconductor device of the present embodiment can be manufactured by the manufacturing method described above. In this method, as described above, in addition to the p$^-$-type layer 4a and the p$^+$-type layer 4b, the n+-type layer 3b and the n+-type layer 5 and the n-type layer 3c and the n-type current dispersion layer 6 are formed between after the formation of the n−-type drift layer 2 and before the formation of the p-type base region 7. Although a plurality of layers are epitaxially grown, the p+-type layer 4b after the formation of the p−-type layer 4a has the same conductivity type, and the n+-type layer 3b and the n+-type layer 5 and the n-type layer 3c and the type current dispersion layer 6 are also of the same conductivity type. Therefore, the same conductivity type ones can be easily and continuously formed in the same CVD apparatus. Accordingly, for forming these multiple layers, the epitaxial growth can be performed two times, and the manufacturing process of the SiC semiconductor device can be simplified, and the manufacturing cost can be reduced.

Second Embodiment

A second embodiment will be described. This embodiment is different from the first embodiment in that the n+-type layer 5 is absent and a configuration of the p-type connection layer 9 is changed. The other configurations of the present embodiment are the same as those in the first embodiment. Only portions different from the first embodiment will be described.

Figure 4:
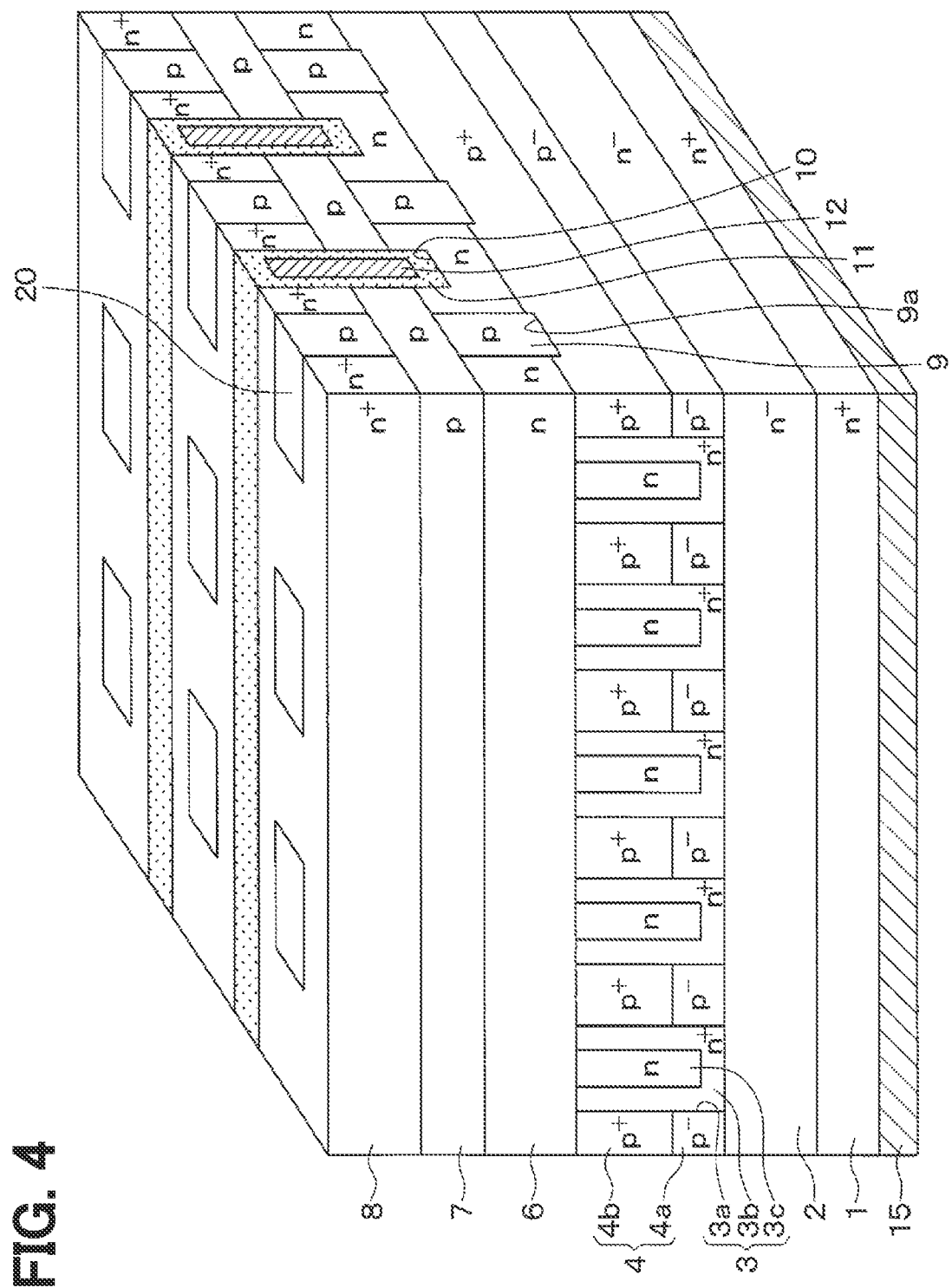
FIG. 4 is a perspective sectional view showing part of an SiC semiconductor device according to a second embodiment.

As shown in FIG. 4, in the present embodiment, the n+-type layer 5 provided in the SiC semiconductor device of the first embodiment is absent, and the n-type current dispersion layer 6 is directly formed on the JFET portions 3 and the electric field block layers 4.

In this way, there is provided a structure in which the n+-type layer 5 is absent. The structure in which the n+-type layer 5 is absent can be formed by forming the n-type layer 3c and thereafter removing, by a planarization process outside the trench 3a such as CMP (chemical mechanical polishing) or the like, the n+-type layer 5 and the n-type layer 3c which were formed at the same time when the n+-type layer 3b was formed. In this case, since the formation of the n-type layer 3c and the formation of the n-type current dispersion layer 6 are not performed continuously but are performed separately, it is possible to set the n-type impurity concentrations of the n-type layer 3c and the n-type current dispersion layer 6 independently of each other. Therefore, while setting the n-type impurity concentration of the n-type layer 3c to an optimum concentration for the JFET portions 3, it is possible to set the n-type impurity concentration of the n-type current dispersion layer 6 to a larger concentration, for example. It is possible to perform concentration controls to easily adjust these to suitable concentrations and it is possible to easily make these.

Further, the p-type connection layer 9 is formed only below the p-type base region 7. A p-type plug layer 20 formed from the surface of the n+-type source region 8 is formed above the p-type base region 7 so that the p-type plug layer 20 is electrically connected to the source electrode 14. The p-type connection layer 9 may be formed only below the p-type base region 7 so that the p-type base region 7, the p-type connection layer 9, and the electric field block layer 4 are connected to the source potential through the p-type plug layer 20.

The p-type connection layer 9 can be formed by forming the deep trench 9a and then filling p-type SiC as described in the first embodiment but may be formed by ion implantation. In this regard, when the ion implantation is performed on SiC, it is difficult to increase a range because the SiC is hard. For this reason, a preferable structure is such that the p-type connection layer 9 is formed only below the p-type base region 7 as in the present embodiment, because the range of ion implantation can be shortened.

An upper surface layout of the p-type plug layer 20 is arbitrary, and may have any structure as long as the p-type plug layer 20 is in contact with at least the p-type base region 7. In the present embodiment, the p-type plug layer 20 has a dot-like layout in which a plurality of p-type plug layers 20 are arranged in the longer direction of the trench gate structure.

The SiC semiconductor device having this structure is the same as the first embodiment except that: the p-type connection layer 9 is formed before the p-type base region 7 is formed; and the p-type plug layer 20 is formed after the n+-type source region 8 is formed. The p-type connection layer 9 may be formed by: forming the above deep trench 9a and then forming the p-type SiC so as to fill the deep trench 9a; or performing ion implantation of p-type impurity into the n-type current dispersion layer 6. Similarly, the p-type plug layer 20 may be formed by: forming a trench in the n+-type source region 8 and then forming p-type SiC so as to fill this trench; or performing ion implantation of p-type impurity into the n+-type source region 8. When the p-type connection layer 9 or the p-type plug layer 20 is formed by the ion implantation, the manufacturing cost may be increased but process stability is high and yield improvement can be realized.

Third Embodiment

A third embodiment will be described. The present embodiment differs from the first and second embodiments in the structure of the JFET portions 3. The rest is the same as the first and second embodiments. Only the portions different from the first and second embodiments will be described. The present embodiment will be described by taking the structure of the first embodiment as an example, but the present embodiment is applicable to the structure of the second embodiment.

Figure 5:
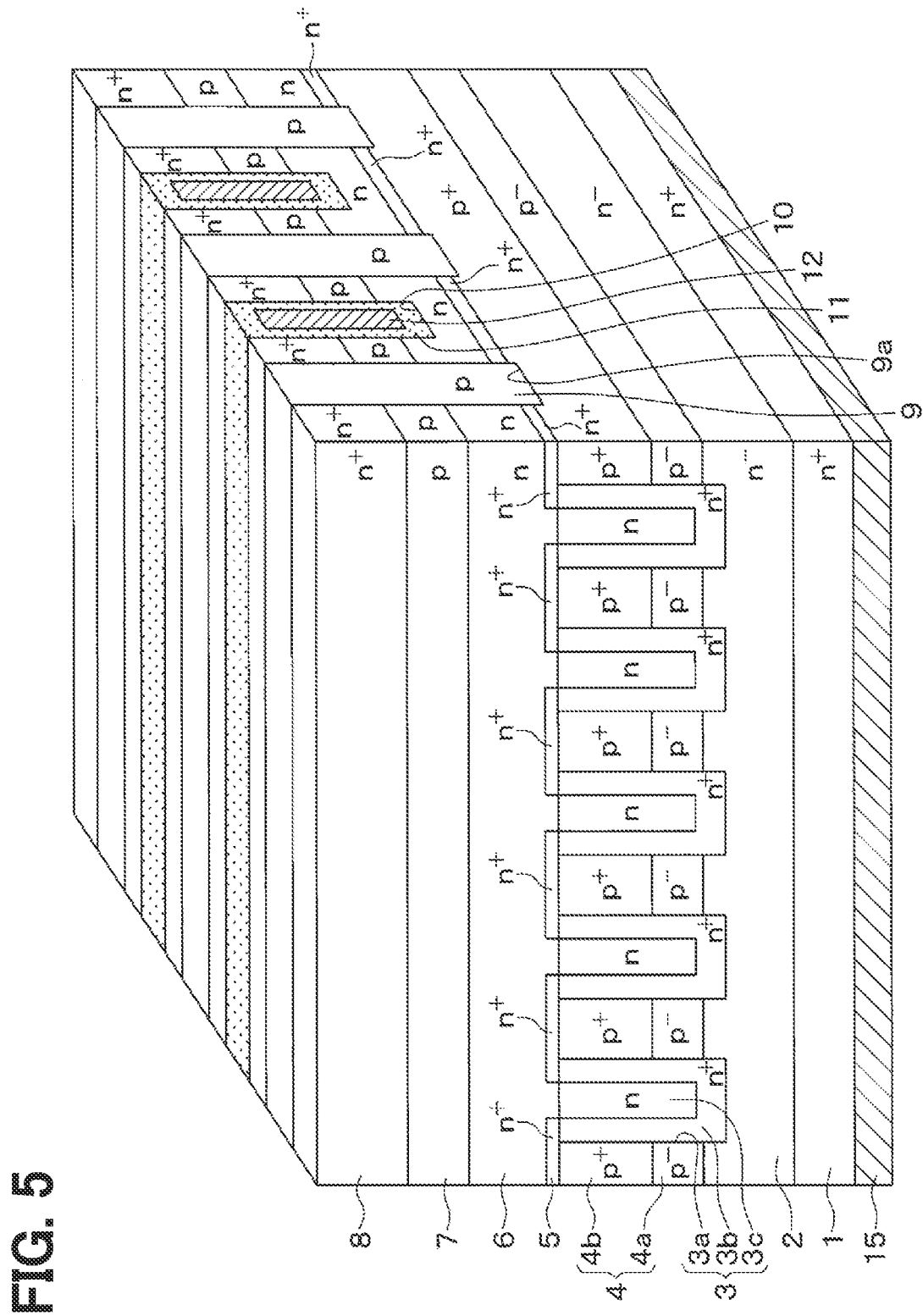
FIG. 5 is a perspective sectional view showing part of an SiC semiconductor device according to a third embodiment.

As shown in FIG. 5, in the present embodiment, the n+-type layer 3b is deeper than the electric field block layer 4. Specifically, the trench 3 does not end at the surface of the n−-type drift layer 2 but reaches an intermediate position in the thickness of the n−-type drift layer 2 so that the bottom surface of the trench 3a is below the bottom surface of the electric field block layer 4, that is, on the n+-type substrate 1 side.

As described above, it is possible to provide not only the structure in which the bottom surfaces of the JFET portions 3 and the bottom surfaces of the electric field block layer 4 are on the same plane as in the first embodiment but also the structure in which the bottom surfaces of the JFET portions 3 are located below the bottom surfaces of the electric field block layers 4. With this structure, the depletion layer extending from the electric field block layer 4 into the n−-type drift layer 2 can be further suppressed from entering into below the JFET portion 3. Therefore, the narrowing of the current outlet in the JFET portion 3 can be further suppressed, and the low on-resistance can be achieved.

In the SiC semiconductor device having such a structure, it is only necessary to increase the depth of the trench 3a as compared with the first embodiment. Therefore, the SiC semiconductor device of the present embodiment can be manufactured by a manufacturing method basically similar to that of the first embodiment.

Fourth Embodiment

A fourth embodiment will be described. The present embodiment is different from the first to third embodiments in that the p-type impurity concentration of the electric field block layer 4 is changed, and the rest is the same as the first to third embodiments. Only portions different from the third embodiment will be described.

In the present embodiment, the p⁻-type layer 4a of the electric field block layer 4 has the gradient of the p-type impurity concentration, unlike the first to third embodiments. Note that the basic structure of the SiC semiconductor device of the present embodiment is exactly the same as the first to third embodiments.

Figure 6:
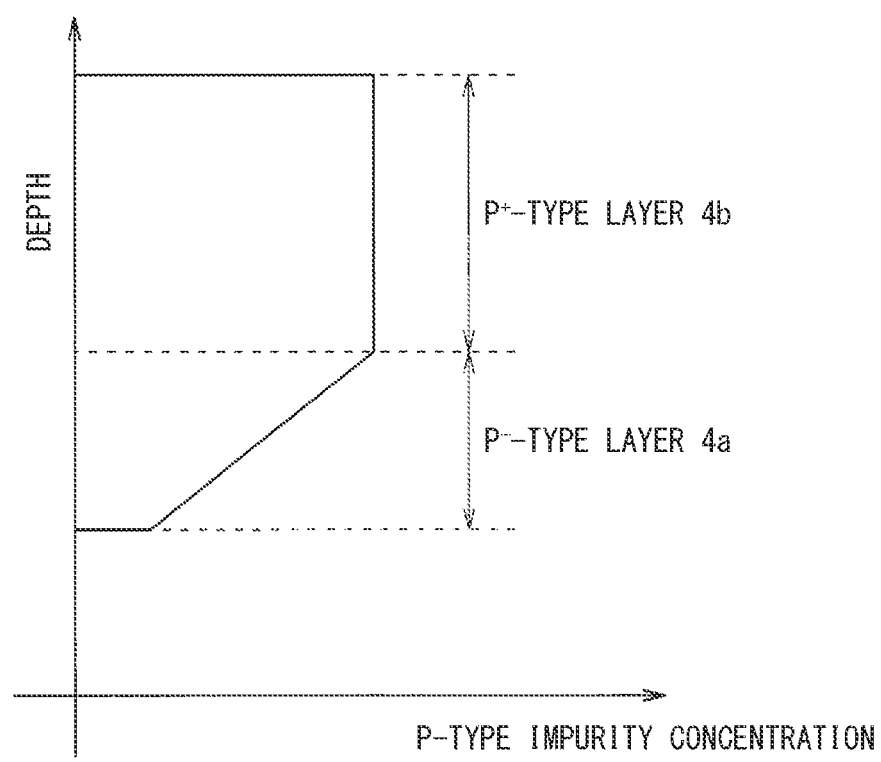
FIG. 6 is a diagram showing an impurity concentration distribution of an electric field block layer of an SiC semiconductor device according to a fourth embodiment.

Specifically, as shown in FIG. 6, the p-type impurity concentration of the p⁻-type layer 4a is gradually increased from below to above, that is, with increasing distance from the n⁻-type drift layer 2, and the concentration is increased to substantially the same value as that of the p⁺-type layer 4b. This structure is realized by, in forming the p-type layer 4a, gradually increasing the introduction amount of the gas serving as the p-type dopant to finally reach the introduction amount that is used when the p⁺-type layer 4b is formed.

As for the electric field block layer 4, the larger the p-type impurity concentration is, the more the electric field suppression effect at the OFF time is improved. However, the electric field absorption effect of reducing the extension amount of the two-dimensional depletion layer into the n⁻-type drift layer 2 is reduced. Therefore, by providing a gradient of the p-type impurity concentration to the p⁻-type layer 4a as in the present embodiment, it is possible to achieve both the electric field suppression effect and the electric field absorption effect.

Other Embodiments

Although the present disclosure has been described in accordance with the above-described embodiments, the present disclosure is not limited to the embodiments, and covers various modification examples and modifications within equivalent ranges. In addition, various combinations and forms, as well as other combinations and forms, including only a single, more or less element, are also within the spirit and scope of the present disclosure.

For example, the above respective embodiments describe the structure in which the electric field block layer 4 is connected to the source electrode 14 so as to have the source potential. However, there may be provided a structure in which the electric field block layer 4 is separated from the p-type base region 7 and functions as a second gate for adjusting the extension amount of the depletion layer of the JFET portion 3 in the case of voltage application to the electric field block layer 4. In this case, the electric field block layer 4 may be configured to be electrically connected to the gate electrode 12 and applied with the gate voltage, or connected to the drain electrode 15 and applied with the drain voltage.

Furthermore, the width of each JFET portion 3 does not need to be constant, and may have, for example, a tapered cross-section such that the width gradually decreases toward the drain electrode 15.

Furthermore, various dimensions such as the thickness and the width and the impurity concentrations of portions constituting the SiC semiconductor device described in the above respective embodiments are merely examples. Also, although the plurality of JFET portions 3 and the plurality of electric field block layers 4 are alternately arranged in a stripe manner, this is an illustration of the stripe manner arrangement in the cell region, and they may not have a stripe structure in the outside of the cell region. For example, a connecting region from the cell region to the outer peripheral region may be filled with the electric field block layer 4, and the plurality of electric field block layers 4 formed in the cell region may be connected to the electric field block layer in the connecting region so that they form a continuous portion.

In the first embodiment and the like, the n-channel vertical MOSFET in which the first conductivity type is n-type and the second conductivity type is p-type is described as an example. However, the vertical MOSFT may be of p-channel type in which the conductivity types of respective constituent portion are inverted. In the above description, the vertical MOSFET has been described as an example of the semiconductor element. However, the present disclosure is applicable to an IGBT which has a similar structure. An n-channel type IGBT is provided by changing the conductivity type of the n⁺-type substrate 1 in the above-described embodiments from the n-type to the p-type only, and other structures and manufacturing methods are the same as those in the above-described embodiments.

In the above embodiments, the SiC semiconductor device has been described as an example of the semiconductor device. However, this is merely an example, and the present disclosure is applicable to a semiconductor device using Si, and also applicable to other wide band gap semiconductor devices, for example, a semiconductor device using GaN, diamond, AlN, or the like.

What is claimed is:

1. A manufacturing method for a semiconductor device including a semiconductor element of inversion type, the method comprising:
    preparing a substrate made of semiconductor and having a first conductivity type or a second conductivity type;
    forming a drift layer above the substrate, wherein the drift layer is made of semiconductor, has the first conductivity type, and has an impurity concentration smaller than that of the substrate;
    forming an electric field block layer above the drift layer, wherein the electric field block layer is made of semiconductor and has the second conductivity type;
    forming a plurality of trenches arranged in a stripe manner in the electric field block layer so that a longer direction of a respective trench is one direction, and thereafter, forming a plurality of JFET portions by providing semiconductor of the first conductivity type in the plurality of trenches, thereby forming a saturation current suppression layer which includes a plurality of electric field block layers arranged in a stripe manner and the plurality of JFET portions arranged in a stripe manner, wherein: a longer direction of a respective JFET portion is the one direction; a longer direction of a respective electric field block layers is the one direction; and the plurality of electric field block layers and the plurality of JFET portions are alternately arranged;
    forming a current dispersion layer above the saturation current suppression layer, wherein the current dispersion layer is made of semiconductor, has the first conductivity type, and has a first conductivity type impurity concentration larger than that of the drift layer;
    forming a base region above the saturation current suppression layer, wherein the base region is made of semiconductor and has the second conductivity type;
    forming a source region above the base region, wherein the source region is made of semiconductor, has the first conductivity type, and has a first conductivity type impurity concentration larger than that of the drift layer;

forming a plurality of trench gate structures, including
forming a plurality of gate trenches which are from a surface of the source region and deeper than the base region and which are arranged in a stripe manner, wherein a longer direction of a respective gate trench intersects with the one direction; and
forming a gate insulating film on an inner wall surface of a respective gate trench and forming a gate electrode on the gate insulating film;
forming a source electrode electrically connected to the source region; and
forming a drain electrode on a back side of the substrate, wherein:
forming the plurality of JFET portions includes
forming: a first layer located at a bottom surface and a side surface of the trench and having a first conductivity type impurity concentration larger than that of the drift layer; and a second layer located above the first layer and having a first conductivity type impurity concentration smaller than that of the drift layer.

2. The manufacturing method according to claim 1, wherein:
forming the electric field block layer includes:
as the electric field block layer, epitaxially growing a lower layer portion and an upper layer portion continuously, wherein the lower layer portion contacts with the drift layer and the upper layer portion has a second conductivity type impurity concentration larger than the lower layer portion.

3. The manufacturing method according to claim 2, wherein:
forming the electric field block layer is performed so that the lower layer portion has the second conductivity type impurity concentration that gradually increases in a direction from the drift layer to the upper layer portion.

4. The manufacturing method according to claim 1, wherein:
forming the plurality of JFET portions and forming the current dispersion layer are performed continuously;
epitaxial growth of the first layer and the second layer of the plurality of JFET portions are performed continuously; and
epitaxial growth of the current dispersion layer is performed at the same time as the epitaxial growth of the second layer is performed.

5. The manufacturing method according to claim 1, wherein:
forming the plurality of JFET portions includes:
epitaxially growing the first layer and the second layer of the plurality of JFET portions continuously; and
thereafter, by planarization, removing portions of the first layer and the second layer outside the trench, whereby the first layer and the second layer are formed only in the trench; and
forming the current dispersion layer includes:
forming the current dispersion layer above the first layer and the second layer formed only in the trench and above the electric field block layer.

6. The manufacturing method according to claim 1, further comprising:
forming a deep trench that, from a surface of the source region, penetrates the base region and the current dispersion layer and reaches the electric field block layer; and
forming a connection layer in the deep trench, wherein the connection layer has the second conductivity type and connects the base region and the electric field block layer.

7. The manufacturing method according to claim 4, further comprising:
after forming the current dispersion layer and before forming the base region, forming a connection layer reaching the electric field block layer by performing ion implantation of second conductivity type impurity into the current dispersion layer; and
after forming the source region, forming a second conductivity type plug layer reaching the base region by performing ion implantation of second conductivity type impurity into the source region.

* * * * *